US012135246B2

(12) United States Patent
Qian et al.

(10) Patent No.: US 12,135,246 B2
(45) Date of Patent: Nov. 5, 2024

(54) WIRELESSLY POWERED RESISTIVE SENSOR (71) Applicant: Board of Trustees of Michigan State University, East Lansing, MI (US)

(72) Inventors: Chunqi Qian, Okemos, MI (US); Wei Qian, Okemos, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 436 days.

(21) Appl. No.: 17/693,542

(22) Filed: Mar. 14, 2022

(65) Prior Publication Data
US 2022/0291054 A1 Sep. 15, 2022

Related U.S. Application Data (60) Provisional application No. 63/161,097, filed on Mar. 15, 2021.

(51) Int. Cl.
*G01K 7/18* (2006.01)
*H03H 11/02* (2006.01)
(52) U.S. Cl.
CPC ............... *G01K 7/18* (2013.01); *H03H 11/02* (2013.01)
(58) Field of Classification Search
CPC ............ G01K 7/18; G01K 1/024; G01K 7/32; G01K 7/22; H03H 11/02
See application file for complete search history.

(56) References Cited

U.S. PATENT DOCUMENTS

| 2006/0261703 | A1* | 11/2006 | Quevy | G01K 7/32 310/315 |
| 2012/0001492 | A9* | 1/2012 | Cook | H02J 50/20 307/104 |
| 2014/0266482 | A1* | 9/2014 | Ishii | H03H 11/481 333/216 |
| 2015/0128707 | A1* | 5/2015 | Viikari | H04B 1/28 73/584 |

(Continued)

OTHER PUBLICATIONS

Nabipoor, M. et al., "A New Passive Telemetry LC Pressure and Temperature Sensor Optimized for TPMS", International Mems Conference 2006, vol. 34, pp. 770-775, 2006. doi: 10.1088/1742-6596/34/1/127.

(Continued)

*Primary Examiner* — Alvaro E Fortich
(74) *Attorney, Agent, or Firm* — Harness, Dickey & Pierce, PLC (57) ABSTRACT

A wirelessly powered resistive sensor is presented. The sensor includes: an antenna; a parametric resonator and a resistive loop circuit. The parametric resonator is configured to receive a pumping signal from the antenna and operable to oscillate at two frequencies. The resistive loop circuit is inductively coupled to the parametric resonator, such that oscillation frequency of the parametric resonator changes (e.g., linearly) with changes in resistance of the resistance loop circuit. The resistance of the resistor in the resistive loop circuit approximately equals the impedance of the resistive loop circuit at one resonance frequency of the parametric resonator. The resistive sensor may further include a resonator enhancer circuit arranged adjacent to the parametric resonator and operates to resonate at frequency of the pumping signal.

12 Claims, 9 Drawing Sheets

(56) References Cited

U.S. PATENT DOCUMENTS

2019/0044459 A1\* 2/2019 Degertekin ............. H02J 50/15

OTHER PUBLICATIONS

Li, Jian-Hua et al., "A Novel Thermistor-Based RF Power Sensor With Wheatstone Bridge Fabricating on MEMS Membrane", Journal of Microelectromechanical Systems, vol. 29, pp. 1314-1321, 2020. doi: 110.1109/JMEMS.2020.3011994.

Kocer, Fathih et al., "An RF-Powered, Wireless CMOS Temperature Sensor", IEEE Sensors Journal, vol. 6, pp. 557-564, 2006. doi: 10.1109/JSEN.2006.874457.

Khan, M. Waqas A. et al., "Remotely Powered Piezoresistive Pressure Sensor: Toward Wireless Monitoring of Intracranial Pressure", IEEE Microwave and Wireless Components Letters, vol. 26, pp. 549-551, Jul. 2016. doi: 10.1109/Lmwc.2016.2574836.

Reinisch, Hannes et al., "A Multifrequency Passive Sensing Tag With On-Chip Temperature Sensor and Off-Chip Sensor Interface Using EPC HF and UHF RFID Technology", IEEE Journal of Solid-State Circuits, vol. 46, pp. 3075-3088, Dec. 2011. doi: 10.1109/Jssc.2011.2167548.

Chen, Zhongbin et al., "Design of An Ultra-Low Power Wireless Temperature Sensor Based on Backscattering Mechanism", Sensing and Imaging, vol. 19, Jul. 5, 2018. doi: 10.1007/s11220-018-0207-x.

Yin, Jun et al., "A System-On-Chip EPC Gen-2 Passive UHF RFID Tag With Embedded Temperature Sensor", IEEE Journal of Solid-State Circuits, vol. 45, pp. 2404-2420, Nov. 2010.

Law, Man Kay et al., "A Sub-µ W Embedded CMOS Temperature Sensor for RFID Food Monitoring Application", IEEE Journal of Solid-State Circuits, vol. 45, pp. 1246-1255, Jun. 2010. doi: 10.1109/Jssc.2010.20147456.

Xin, Haoming et al., "A 174 pW-488.3 nW 1 S/s-100 kS/s All-Dynamic Resistive Temperature Sensor With Speed/Resolution/Resistance Adaptability", IEEE Solid-State Circuits Letters, vol. 1, pp. 70-73, Mar. 2018. doi: 10.1109/Lssc.2018.2827883.

Escobedo, Pablo et al., "Smart Bandage With Wireless Strain and Temperature Sensors and Batteryless NFC Tag", IEEE Internet of Things Journal, vol. 8, pp. 5093-5100, Mar. 15, 2021. doi: 10.1109/Jiot.2020.3048282.

Wang, Yi-Fei et al., "Fully Printed PEDOT: PSS-Based Temperature Sensor With High Humidity Stability For Wireless Healthcare Monitoring", Scinetific Reports, vol. 10, Feb. 12, 2020. doi: 10.1038/S41598-020-59432-2.

Consul-Pacareu, Sergi et al., "Body-Worn Fully-Passive Wireless Analog Sensors for Physiological Signal Capture Through Load Modulation Using Resistive Transducers", 2014 IEEE Healthcare Innovation Conference (HIC), pp. 67-70, 2014.

Bona, Michele et al., "Telemetric Technique for Passive Resistive Sensors Based on Impedance Real Part Measurement at Fixed Frequency", IEEE Transactions on Instrumentation and Measurement, vol. 67, pp. 2160-2168, Sep. 2018. doi: 10.1109/Tim.2018.2811279.

Bona, Michele et al., "Telemetric Technique for Wireless Strain Measurement From an Inkjet-Printed Resistive Sensor", IEEE Transactions on Instrumentation and Measurement, vol. 66, pp. 583-591, Apr. 2017. doi: 10.1109/Tim.2016.2607958.

Consul-Pacareu, Sergi et al., "Design and Analysis of a Novel Wireless Resistive Analog Passive Sensor Technique", IET Wireless Sensor Systems, vol. 8, pp. 45-51, Apr. 2018. doi: 10.1049/iet-wss.2017.0064.

Karipott, Salil Sidharthan et al., "An Embedded Wireless Temperature Sensor for Orthopedic Implants", IEEE Sensors Journal, vol. 18, pp. 1265-1272, Feb. 1, 2018. doi: 10.1109/Jsen.2017.2780226.

Albrecht, Andreas et al., "Screen-Printed Chipless Wireless Temperature Sensor", IEEE Sensors Journal, vol. 19, pp. 12011-12015, Dec. 15, 2019. doi: 10.1109/Jsen.2019.2940836.

Sauer, Sebastian et al., "A Wireless Passive Humidity Threshold Monitoring Solution Based on a Permanent Resistance Change", Procedia Engineering, vol. 87, pp. 688-691, 2014. doi: 10.1016/j.proeng.2014.11.624.

Mannoor, Manu S. et al., "Graphene-Based Wireless Bacteria Detection on Tooth Enamel", Nature Communications, vol. 3, p. 763, Mar. 2012. doi: 10.1038/Ncomms1767.

Sileo, Leonardo et al., "Wireless System for Biological Signal Recording With Gallium Arsenide High Electron Mobility Transistors as Sensing Elements", Microelectronic Engineering, vol. 111, pp. 354-359, Nov. 2013.

Nopper, Reinhard et al., "Wireless Readout of Passive LC Sensors", IEEE Transactions on Instrumentation and Measurement, vol. 59, pp. 2450-2457, Sep. 10, 2010. doi: 10.1109/Tim.2009.2032966.

Pichorim, Sergio Francisco et al., "A Novel Method to Read Remotely Resonant Passive Sensors in Biotelemetric Systems", IEEE Sensors Journal, vol. 8, pp. 6-11, Jan.-Feb. 2008. doi: 10.1109/Jsen.2007.912386.

Viikari, Ville et al., "Intermodulation Read-Out Principle for Passive Wireless Sensors", IEEE Transactions on Microwave Theory and Techniques, vol. 59, pp. 1025-1031, Apr. 2011. doi: 10.1109/Tmtt.2011.2108309.

Girbau, David et al., "Passive Wireless Temperature Sensor Based on Time-Coded UWB Chipless RFID Tags", IEEE Transactions on Microwave Theory and Techniques, vol. 60, pp. 3623-3632, Nov. 2012. doi: 10.1109/Tmtt.2012.2213838.

Zhao, Chongwen et al., "Contactless Measurement of Temperature Based on Transient Wireless Energy Transmission", 2013 Twenty-Eighth Annual IEEE Applied Power Electronics Conference and Exposition (Apec 2013), pp. 3107-31111, 2013. doi: 10.1109/APEC.2013.6520744.

\* cited by examiner

WIRELESSLY POWERED RESISTIVE SENSOR

CROSS-REFERENCE TO RELATED APPLICATIONS

This application claims the benefit of U.S. Provisional Application No. 63/161,097, filed on Mar. 15, 2021. The entire disclosure of the above application is incorporated herein by reference.

FIELD

The present disclosure relates to wirelessly powered sensors.

BACKGROUND

Resistive transducers are widely utilized to convert environmental parameters, such as temperature, into electrical signals. Compared to capacitive or inductive transducers, resistive transducers are often easier to fabricate and more readily available. To quantify resistance changes inside a sensing platform, a common method is to compare voltage drops between the sensing resistor and a reference resistor in an electric bridge. This design, however, is most suitable for circuits with wired connections. For wireless sensors embedded inside enclosed cavities, voltage drops across the electric bridge are usually encoded onto a wireless carrier wave by a Voltage-to-Frequency converter or Analog-to-Digital converter, both of which require DC power to operate. As a result, additional circuit modules such as rectifiers and voltage regulators are required to convert RF power into DC power. Even though the voltage regulator, the RF transmitter and the temperature sensor can in principle be integrated into a single chip, commercial off-the-shelf (COT) integrated circuits are normally enclosed inside cm-scale packages. Such an IC chip is hard to fit inside confined body cavities, not to mention the additional power harvesting antenna and voltage biasing circuitry that are required to operate the IC.

Alternatively, passive LC resonators have been utilized to estimate resistance changes. By connecting the sensing resistor to the LC resonator, resistance changes can affect the line shape of the resonator's frequency response curve. However, direct measurement of the frequency response curve is effective only when the detection antenna is close enough to the resonator. When the distance separation between the resonator and the detection antenna is large, back-scattered signals from the resonator will be much smaller than the instrumental background, making the frequency response curve completely buried beneath the instrumental noise floor. Direct measurement is even more challenging when the resonator is designed to have reduced quality factor for improved responses to resistance variation.

This section provides background information related to the present disclosure which is not necessarily prior art.

SUMMARY

This section provides a general summary of the disclosure, and is not a comprehensive disclosure of its full scope or all of its features.

A wirelessly powered resistive sensor is presented. The sensor includes: an antenna; a parametric resonator and a resistive loop circuit. The parametric resonator is configured to receive a pumping signal from the antenna and operable to oscillate at two frequencies. The resistive loop circuit is inductively coupled to the parametric resonator, such that oscillation frequency of the parametric resonator changes (e.g., linearly) with changes in resistance of the resistance loop circuit. When the resistance of the resistor in the resistive loop circuit approximately equals the impedance of the resistive loop circuit at one resonance frequency of the parametric resonator, the transducer has maximum linear response.

In one aspect, the resistive sensor further includes a resonator enhancer circuit arranged adjacent to the parametric resonator and operates to resonate at frequency of the pumping signal Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

Figure 1:
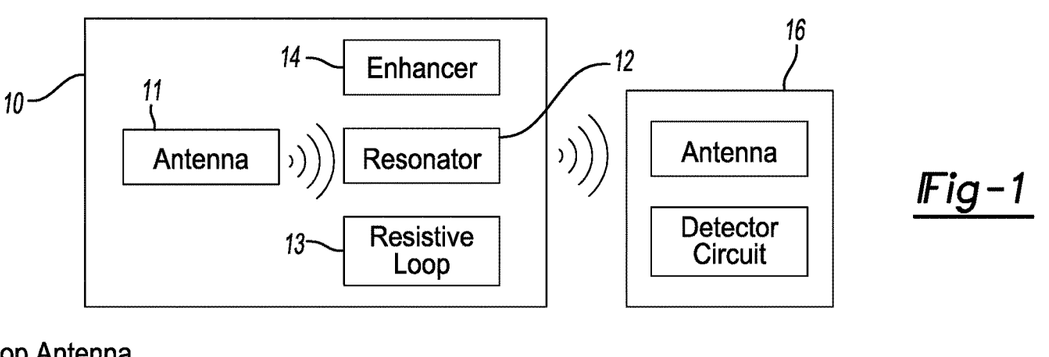
FIG. 1 is a diagram of a wirelessly powered resistive sensor.

FIG. 1 depicts a wirelessly powered resistive sensor 10 in accordance with this disclosure. The resistive sensor 10 is comprised generally of: an antenna 11; a parametric resonator 12; and a resistive loop circuit 13. The antenna 11 may be coupled via a wire or wirelessly to the parametric resonator 12. The resistive sensor 10 may optionally include a resonator enhancer circuit 14. The resistive sensor 10 may also be interfaced wirelessly to a detection device 16 as will be further described below.

The parametric resonator 12 is comprised of at least one electronic component having variable reactance. The parametric resonator 12 is configured to receive a pumping signal from the antenna 11 and operates to oscillate at two frequencies. i.e., a first resonant mode and a second resonant mode. In one embodiment, the parametric resonator is comprised of two loop circuits which share a common circuit path, where at last one loop circuit includes a varactor. In operation, the frequency of the pumping signal is set to sum of resonance frequency of the parametric resonator operating in the first resonant mode and resonance frequency of the parametric resonator operating in the second resonant mode.

The resistive loop circuit 13 is inductively coupled to the parametric resonator 12, such that oscillation frequency of the parametric resonator 12 changes with changes in resistance of the resistance loop circuit 13. More specifically, the oscillation frequency of the parametric resonator changes linearly with changes in resistance of the resistance loop circuit. When the resistance of the resistor in the resistive loop circuit approximately equals the impedance of the resistive loop circuit at one resonance frequency of the parametric resonator, the transducer has optimal response, where approximately equal means within ±20 percent of each other. In an example embodiment, the resistive loop circuit 13 includes a resistor although other implementations are contemplated by this disclosure.

In one implementation, the resistor of the resistive loop circuit is configured to sense temperature changes, such that oscillation frequency of the resistor changes linearly with temperature changes. It is readily understood that the resistive sensor 10 can be used for other applications, including but not limited to sensing humidity, bacteria infection, neuronal voltage, pH, pressure, and strain.

In some embodiments, a resonator enhancer circuit 14 is arranged adjacent to the parametric resonator 12 and operates to resonate at frequency of the pumping signal. The operating principle of this sensor is further described.

Figure 2A:
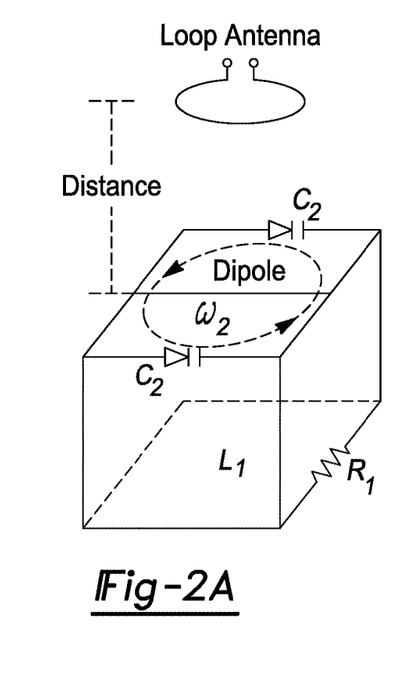
FIGS. 2A-2C are diagrams illustrating an example embodiment of the wirelessly powered resistive sensor.
Figure 2B:
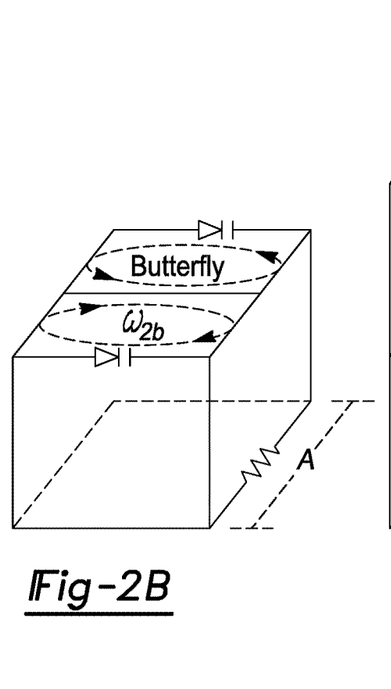
Figure 2C:
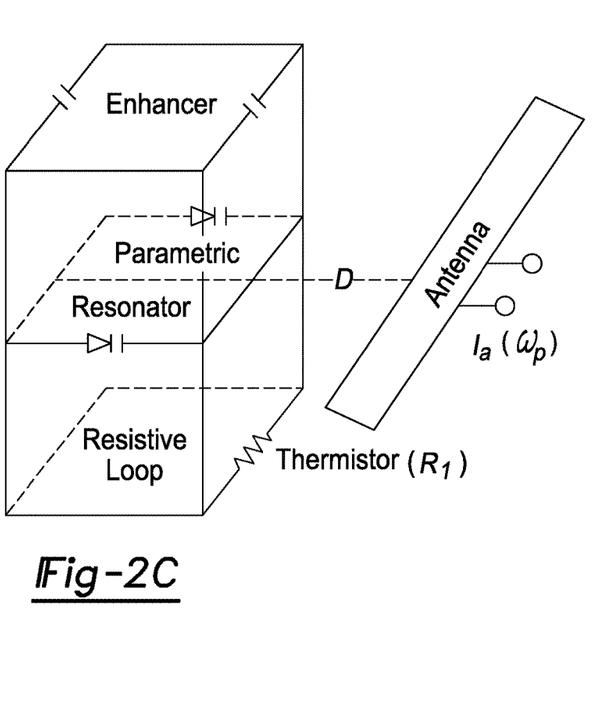

With reference to FIG. 2A-2C, the core components of the wireless sensor is the resistive loop 13 coaxially overlaid with the parametric resonator 12. Through inductive coupling, resistance change in the former is converted into reactance change in the later. The effective impedance inside the parametric resonator is:

$$Z = \frac{\omega^2 M^2 (R_1 - j\omega L_1)}{R_1^2 + \omega^2 L_1^2} + R_2 + j\omega L_2 + \frac{2}{j\omega C_2} =$$

$$\frac{\omega^2 M^2}{R_1 + \omega^2 L_1^2/R_1} + R_2 + j\left(-\frac{\omega^2 M^2 \omega L_1}{R_1^2 + \omega^2 L_1^2} + \omega L_2 - \frac{2}{\omega C_2}\right) \equiv R_{2d} + jX_{2d}$$

where $R_1$ and $L_1$ are the sensing resistance and the inductance in the resistive loop, Red and Led are the effective resistance and inductance of the parametric resonator (in its dipole mode), $C_2$ is the effective capacitance of each varactor under zero voltage bias. The resonance frequency $\omega_2$ can be estimated by making the imaginary part of Eq. (1) equal to zero:

$$\omega_2^2 = \frac{L_1^2 - C_2 L_2 R_1^2/2}{C_2 L_1 (L_1 L_2 - M^2)} + \frac{\sqrt{(2L_1^2 + C_2 L_2 R_1^2)^2 - 8C_2 R_1^2 L_1 M^2}}{2C_2 L_1 (L_1 L_2 - M^2)}$$

By correlating $C_2$ with the self-resonance frequency $\omega_{20}$ of the parametric resonator in its stand-alone configuration, i.e., $C_2 = 2/(w_{20}^2 L_2)$, Eq. (2) becomes $$\omega_2^2 = \frac{\omega_{20}^2\left(1 - \frac{R_1^2}{\omega_{20}^2 L_1^2}\right)}{2(1 - M^2/(L_1 L_2))} + \frac{\omega_{20}^2 \sqrt{\left(1 + \frac{R_1^2}{\omega_{20}^2 L_1^2}\right)^2 - \left(\frac{4R_1^2}{\omega_{20}^2 L_1^2}\right)\left(\frac{M^2}{L_1 L_2}\right)}}{2(1 - M^2/(L_1 L_2))} =$$

$$\frac{\omega_{20}^2\left(1 - \frac{R_1^2}{\omega_{20}^2 L_1^2}\right)}{2(1 - \kappa^2)} + \frac{\omega_{20}^2\left(1 + \frac{R_1^2}{\omega_{20}^2 L_1^2}\right)\sqrt{1 - \kappa^2\left(\frac{4R_1^2}{\omega_{20}^2 L_1^2}\right)/\left(1 + \frac{R_1^2}{w_{20}^2 L_1^2}\right)^2}}{2(1 - \kappa^2)}$$

where $\kappa^2 = M^2/(L_1 L_2)$ is the coupling coefficient that is determined by geometric proximity between the parametric resonator and resistive loop. Because the mutual inductance is normally much smaller than the self-inductance (i.e. $\kappa \ll 1$), $4\kappa^2 R_1^2/(\omega_{20}^2 L_1^2) \ll 1$ also holds true. Therefore, Eq. (3) can be approximated as:

$$\omega_2^2 \approx \frac{\omega_{20}^2\left(1 - \frac{R_1^2}{\omega_{20}^2 L_1^2}\right)}{2(1 - k^2)} + \frac{\omega_{20}^2\left(1 + \frac{R_1^2}{\omega_{20}^2 L_1^2}\right)\left(1 - \left(\frac{2k^2 R_1^2}{\omega_{20}^2 L_1^2}\right)\left(\frac{R_1^2}{\omega_{20}^2 L_1^2}\right)^2\right)}{2(1 - k^2)} =$$

$$\frac{\omega_{20}^2}{(1 - k^2)} - \frac{\omega_{20}^2 k^2 \frac{R_1^2}{\omega_{20}^2 L_1^2}}{(1 - k^2)\left(1 + \frac{R_1^2}{\omega_{20}^2 L_1^2}\right)} = \omega_{20}^2 + \frac{\omega_{20}^2 k^2}{(1 - k^2)} \frac{1}{1 + \frac{R_1^2}{\omega_{20}^2 L_1^2}}$$

Therefore, compared to the parametric resonator in its stand-alone configuration, the resistive loop will change its resonance frequency by a factor of:

$$\frac{\omega_2}{\omega_{20}} = \left(1 + \frac{k^2}{\left(1 + \frac{R_1^2}{\omega_{20}^2 L_1^2}\right)(1 - k^2)}\right)^{\frac{1}{2}} \approx 1 + \frac{k^2}{2\left(1 + \frac{R_1^2}{\omega_{20}^2 L_1^2}\right)(1 - k^2)}$$

because the fractional change in thermistor's resistance decreases proportionally with temperature change, i.e. $dR_1/R_1 = -\beta dT$, the following relation can be obtained by taking the derivative of Eq. (5) with respect to temperature:

$$\frac{d(\omega_2/\omega_{20})}{dR_1}\frac{dR_1}{dT} = \frac{\kappa^2\omega_{20}^2 L_1^2 R_1(-\beta R_1)}{(-1+\kappa^2)(R_1^2+L_1^2\omega_{20}^2)^2} \le \frac{\kappa^2\beta}{4(1-\kappa^2)}$$

Eq. (6) becomes maximum when $R_1=L_1\omega_{20}$. At this time, the real part $R_{2d}$ of Eq. (1) is also approaching maximum when the resonance frequency of the coupled resonator $\omega_2$ is not too much deviated from that of the uncoupled resonator $\omega_{20}$. As a result, $R_{2d}$ in Eq. (1) can be considered as approximately constant when $R_1$ is changing around its optimal value at $L_1\omega_2$.

Although the resistance-dependent frequency shift can in principle be measured from the frequency response curve of the coupled resonator, such measurement can be challenging when the resonance frequency shift is much smaller than the bandwidth of the frequency response curve or when the resonator is remotely coupled to the external detection antenna. To improve the measurement accuracy of small frequency shift over large distance separations, the coupled parametric resonator needs to be activated by wireless pumping power, producing a sharp oscillation peak whose frequency shift can be sensitively detected over larger distance separations.

Figure 3:
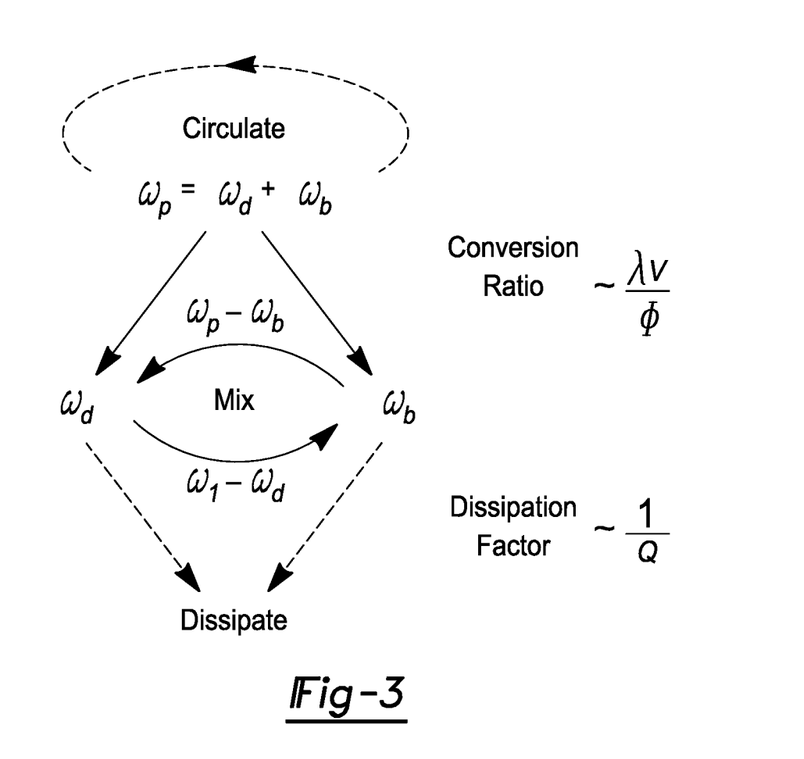
FIG. 3 is a diagram depicting the operation principle of a parametric oscillator.

More specifically, the coupled resonator also has a second (butterfly) resonance mode at $\omega_{2b}$ (FIG. 2B) that is created by bridging the virtual grounds of its first (dipole) resonance mode at $\omega_2$. Although this butterfly mode doesn't directly interact with the resistive loop, it is necessary to sustain circuit oscillation through multiband frequency mixing. By adjusting the pumping frequency equal to the sum of the two resonance frequencies ($\omega_p=\omega_2+\omega_{2b}$), energy exchange between resonance modes is facilitated by nonlinear capacitors, thus enhancing the oscillation currents inside both modes via positive feedback as seen in FIG. 3.

When the dipole mode resonance frequency $\omega_2$ slightly shifts due to temperature variation in the thermistor, $\omega_2+\omega_{2b}$ will be slightly deviated from the pumping frequency $\omega_p$, making the oscillation frequency of each mode slightly deviated from its resonance frequency. The frequency deviation can be estimated by making the reactance-to-resistance ratio equal for both the dipole and butterfly modes:

$$\frac{X_{2d}}{R_{2d}} = \frac{2(\omega_d-\omega_2)L_{2d}}{R_{2d}} = \frac{X_{2b}}{R_{2b}} = \frac{2(\omega_b-\omega_{2b})L_{2b}}{R_{2b}}$$

where $\omega_d$ and $\omega_b$ are oscillation frequencies that are slightly deviated from the dipole and butterfly mode resonance frequencies. $\omega_2$ is the dipole mode resonance frequency that is linearly modulated by the thermistor, and $\omega_{2b}$ is the resonance frequency of the butterfly mode that is unaffected by resistance change. $L_{2d}$ and $L_{2b}$ are effective inductance of the dipole and butterfly modes that are determined by circuit dimensions, $R_2$ and $R_{2b}$ are effective resistance of the dipole and butterfly modes. By plugging $\omega_p=\omega_d+\omega_b$ into Eq. (7), the oscillation frequency of the dipole mode can be expressed as:

$$\omega_d = \frac{\omega_2 L_{2d}/R_{2d} - \omega_{2b}L_{2b}/R_{2b} + \omega_p L_{2b}/R_{2b}}{L_{2b}/R_{2b} + L_{2d}/R_{2d}}$$

In Eq. (8), $\omega_d$ and $\omega_2$ will have an approximate linear relation, because $R_{2d}$ will remain approximately constant at its maximum value when $R_1 \sim \omega_2 L_1$, as mentioned in the paragraph following Eq. (6). Therefore, the relationship between the oscillation frequency shift and the resonance frequency shift can be approximated as:

$$\frac{\partial \omega_d}{\partial \omega_2} \approx \frac{L_{2d}2d/R_{2d}}{L_{2b}/R_{2b}+L_{2d}/R_{2d}} = 1 - \frac{L_{2b}/R_{2b}}{L_{2b}/R_{2b}+L_{2d}/R_{2d}}$$

Meanwhile, the last term in Eq. (9) can be experimentally measured by holding $\omega_2$ constant and observing the oscillation frequency $\omega_d$ as a function of the pumping frequency $\omega_p$.

$$\frac{L_{2b}/R_{2b}}{L_{2b}/R_{2b}+L_{2d}/R_{2d}} = 1 - \frac{\partial \omega_d}{\partial \omega_p}$$

In the example embodiment, the parametric resonator contains two varactor diodes, each of which has voltage-dependent junction capacitance of:

$$C_2(t) = C_{20}\left(1-\frac{V(t)}{\phi}\right)^{-\lambda} \approx C_{20} + \frac{C_{20}\lambda V(t)}{\phi}$$

where $\Phi$ is the diode's junction potential and $\lambda$ is a device constant describing the charge distribution abruptness across the junction. In Eq. (11), the first term is the constant capacitance that is responsible for reactive energy at the pumping frequency $\omega_p$, while the second term is the voltage-dependent capacitance that is responsible for energy conversion from the pumping frequency $\omega_p$ into the dipole and butterfly mode resonance frequencies through parametric mixing process. To sustain circuit oscillation, the required pumping voltage $V_p$ across the varactor can be estimated from:

$$|V_p|\lambda/\phi \approx 1/\sqrt{Q_d Q_b} = 1/Q_{effect}$$

Eq. (12) can also be understood as the equal relation between the fraction of energy converted from the pumping frequency and the fraction of energy dissipated at the dipole and butterfly resonance frequencies as explained in FIG. 3. According to Eq. (12), the required pumping current through the varactor is:

$$I_{2p}=j\omega_p C_{20}|V_p| \approx j\omega_p C_{20}\phi/(\lambda_2\sqrt{Q_d Q_b})$$

To induce $I_{2p}$ inside the parametric resonator, the electromotive force $\xi_{2p}$ to be generated by the activation antenna should be:

$$\xi_{2p} = I_{2p}\left(R_2+j\omega_p L_{2d}-\frac{2j}{\omega_p C_2}\right) \approx I_{2p}\left(\frac{2\omega_p j}{\omega_2^2 C_2}-\frac{2j}{\omega_p C_2}\right)$$

The last approximation in Eq. (14) is obtained by plugging in the relation $L_{2d}=2/(\omega_2^2 C_2)$ and by neglecting the much smaller contribution of circuit resistance $R_2$ to total impedance at the pumping frequency $\omega_p$.

Figure 4A:
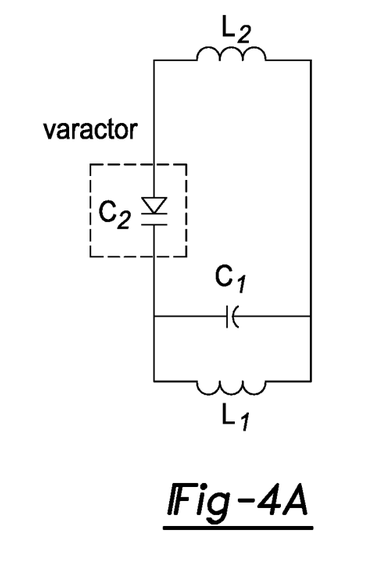
FIGS. 4A and 4B are diagrams illustrating other implementations for the parametric resonator.
Figure 4B:
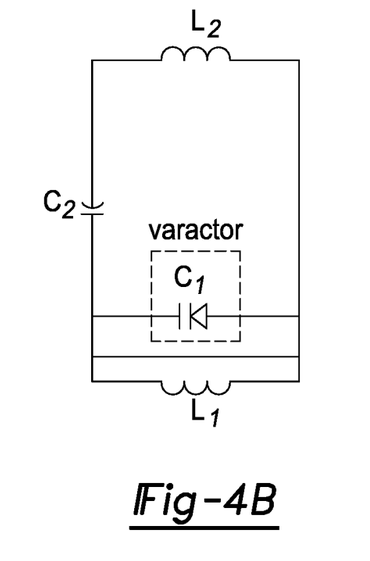

For illustration purposes, the parametric resonator 12 described above was comprised of two loop circuits sharing a common circuit path (FIGS. 2A and 2B), where each of the two loops includes a varactor. FIGS. 4A and 4B illustrate other possible implementations for the parametric resonator 12. Both implementations are comprised of two loop circuits sharing a common circuit path. In FIG. 4A, a capacitor is disposed in the shared circuit path, a varactor is disposed in one of the loops and an inductor is disposed in each of the two loops. In FIG. 4B, a varactor is disposed in the shared circuit path, a capacitor is disposed in one of the loops and an inductor is disposed in each of the two loops. Other implementations for the parametric resonator also fall within the scope of this disclosure.

To improve the pumping power efficiency, we can overlay the parametric resonator with a resonant enhancer circuit as seen in FIG. 2C, so that the highest resonance frequency of the coupled resonator assembly is tuned to the pumping frequency $\omega_p$. At $\omega_p$, the current $I_{2p}$ induced inside the parametric resonator and the current $I_{3p}$ induced inside the resonant enhancer can be estimated from the following two equations:

$$\varphi_{2p} = I_{2p}\left(R_{2d} + j\omega_p L_{2d} + \frac{2}{j\omega_p C_2}\right) + jI_{3p}\omega_p M_{23} \approx$$

$$I_{2p}(R_{2d} + j\omega_p L_{2d} - j\omega_2^2 L_{2d}/\omega_p) + jI_{3p}\omega_p M_{23}$$

$$\varphi_{3p} = I_{3p}\left(R_3 + j\omega_p L_3 + \frac{2}{j\omega_p C_3}\right) + jI_{3p}\omega_p M_{23} =$$

$$I_{3p}(R_3 + j\omega_p L_3 - j\omega_3^2 L_3/\omega_p) + jI_{2p}\omega_p M_{23}$$

where $\varphi_{2p}$ and $\varphi_{3p}$ are the electromotive forces induced in the parametric resonator and the resonant enhancer, $\omega_2$ and $\omega_3$ are their resonance frequencies in their stand-alone configuration, $M_{23}$ is the mutual inductance between coupled resonators. According to Eqns. (15) and (16), the induced current in the parametric resonator is:

$$I_{2p} = \frac{(R_3 + j\omega_p L_3 - j\omega_3^2 L_3/\omega_p)\varphi_{2p} - jM_{23}\omega_p\varphi_{3p}}{\left(\begin{array}{c} R_3 R_{2d} + M_{23}^2\omega_p^2 - L_3 L_{2d}(\omega_p^2 - \omega_3^2)(\omega_p^2 - \omega_2^2)/\omega_p^2 + \\ j(L_3 R_2(\omega_p^2 - \omega_3^2) + L_{2d} R_3(\omega_p^2 - \omega_2^2))/\omega_p \end{array}\right)} \approx$$

$$\frac{(j\omega_p L_3 - j\omega_3^2 L_3/\omega_p)\varphi_{2p} - jM_{23}\omega_p\varphi_{3p}}{\left(\begin{array}{c} M_{23}^2\omega_p^2 - L_3 L_{2d}(\omega_p^2 - \omega_3^2)(\omega_p^2 - \omega_2^2)/\omega_p^2 + \\ j(L_3 R_2(\omega_p^2 - \omega_3^2) + L_{2d} R_3(\omega_p^2 - \omega_2^2))/\omega_p \end{array}\right)}$$

The last approximation in Eq. (17) is valid because the terms $R_3$ in the numerator and $R_3 R_{2d}$ in the denominator have much smaller magnitude than other terms. Also, circuit resonance at the pumping frequency $\varphi_p$ requires $I_{2p}$ to be real-valued, i.e.

$$M_{23}^2\omega_p^2 - L_3 L_{2d}(\omega_p^2 - \omega_3^2)(\omega_p^2 - \omega_2^2)\omega_p^2 = 0$$

When the parametric resonator and the resonant enhancer have identical dimensions, their inductances should be identical:

$$L_{2d} = L_3$$

and the induced electromotive forces should also be identical:

$$\varphi_{2p} = \varphi_{3p}$$

By plugging Eqns. (18-20) into Eq. (17), the electromotive force $\varphi_{2p}$ to be provided by the activation antenna should be:

$$\varphi_{2p} = \varphi_{3p} = \frac{I_{2p}(R_{2d}(\omega_p^2 - \omega_3^2) + R_3(\omega_p^2 - \omega_2^2))}{(\omega_p^2 - \omega_3^2) - \sqrt{(\omega_p^2 - \omega_3^2)(\omega_p^2 - \omega_2^2)}}$$

Eq. (21) describes the required e.m.f. when the activation field is enlarged by a resonant enhancer. On the other hand, Eq. (14) describes the required e.m.f. in the absence of resonant enhancer. By comparing these two equations, the enhancement factor of the activation field is:

$$\frac{\xi_{2P}}{\varphi_{2P}} = \frac{j2\omega_P(1 - \omega_2^2/\omega_p^2)\left(1 - \sqrt{\omega_p^2 - \omega_2^2}/\sqrt{\omega_p^2 - \omega_3^2}\right)}{\omega_2^2 C_2(R_3(\omega_p^2 - \omega_2^2)/(\omega_p^2 - \omega_3^2) + R_{2d})}$$

For demonstration purposes, the sensor's temperature-dependent frequency response is simulated by S-parameters solver in the Advanced Design System (Agilent, CA). The parametric resonator is modelled as the symmetric circuit labelled by red lines in FIG. 5. Each half circuit consists of a 13.35-nH inductor placed in series with a varactor diode (BBY53-02 W) whose voltage-dependent junction capacitance is represented as $C=8.53/(1+V/3.40)^{1.76}$ according to its datasheet value. Two 0.55-Ohm resistors are incorporated into the resonator to make its dipole mode quality factor Q=72, as experimentally measured at 471.6 MHz (the resonator's self-resonance frequency in its stand-alone configuration). To create the butterfly mode at 370.2 MHz, an effective inductance of 4.17 nH is incorporated into the center of the red circuits, bridging the virtual voltage grounds of the dipole mode.

Figure 5:
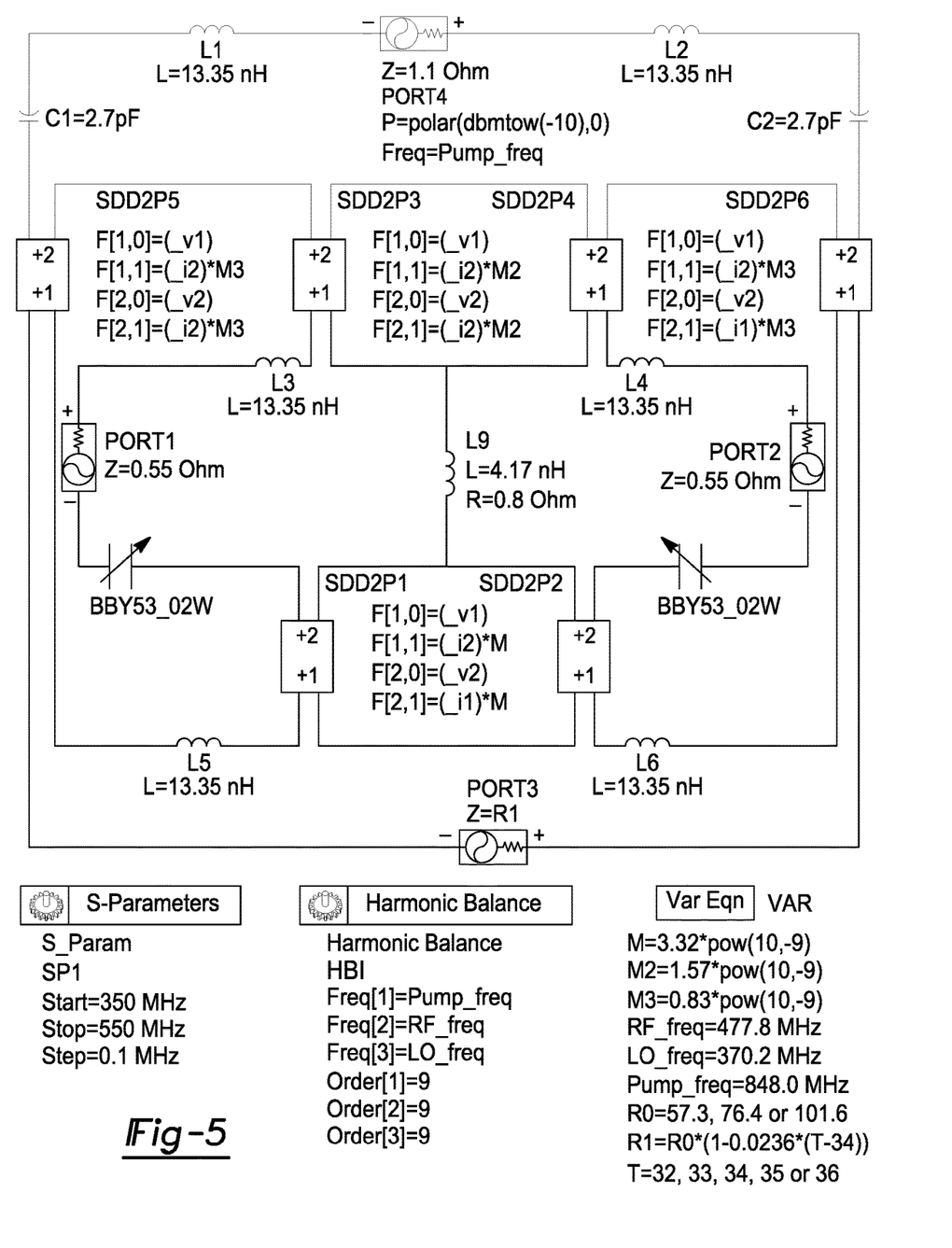
FIG. 5 is a circuit diagram for simulating the wirelessly powered resistive sensor.

The resonant enhancer (labelled in green) is modelled as two 13.35-nH inductors connected in series with two 2.7-pF capacitors. The resistive loop (labelled in blue) is modeled as two 13.35-nH inductors connected in series with a variable resistor $R_1$ whose temperature-dependent resistance is represented as $R_0*(1-0.0236*(T-34))$, corresponding to 2.36% decrease in resistance for every one degree of temperature rise. $R_0$ is the reference resistance at 34 Celsius. To search for the optimal $R_0$ with largest frequency response, multiple sets of simulation are performed when $R_0$ is varied from 57.3 Ohm to 101.6 Ohm. For each $R_0$ value, the circuit's resonance frequency is simulated as a function of temperature T.

The mutual coupling between the resistive loop (labelled in blue) and the parametric resonator (labelled in red) is defined by two Symbolically Defined Devices (pink boxes). In each of these two-node devices, the voltage induced in one node (_v1) is equal to mutual inductance multiplied by the time derivative of current in the other node M*(_i2). Symbolically Defined Devices are also used to describe the mutual coupling (orange box) between the resonant enhancer (green) and the parametric resonator (red), and to describe the mutual coupling (gray boxes) between the resonant enhancer (green) and the resistive loop (blue). The mutual inductance 2M, $2M_2$ and $2M_3$ are set to 6.64 nH, 3.14 nH and 1.66 nH, accounting for the effect of 2.6-mm, 5.1-mm and 7.7-mm substrate thicknesses between individual square conductors.

Figure 6A:
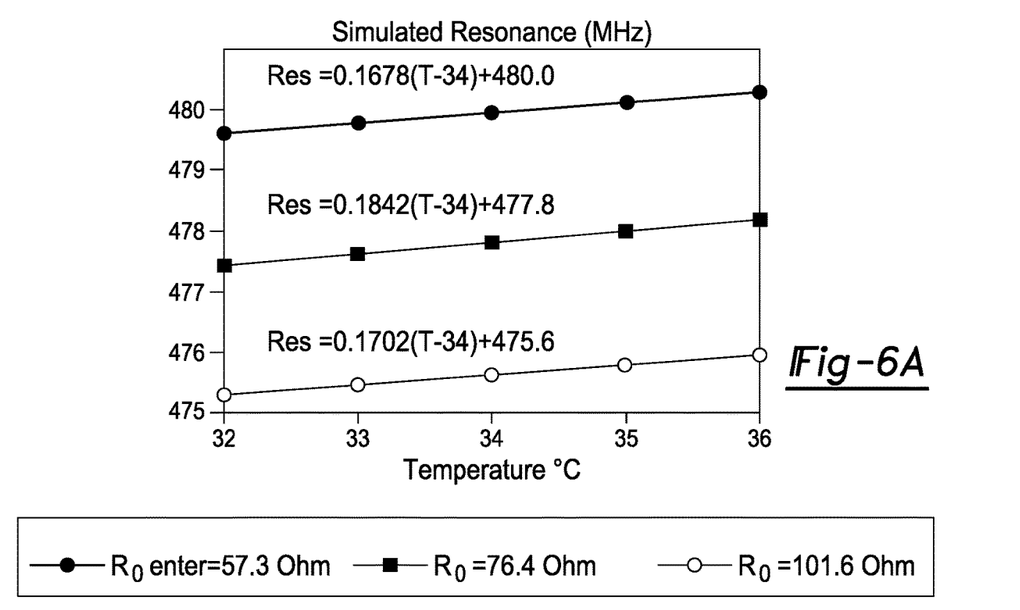
FIG. 6A is a graph showing temperature-dependent resonance frequency simulated for three different thermistors with reference resistance of 57.3 Ohms, 76.4 Ohms and 101.6 Ohms at 34 Celsius.
Figure 6B:
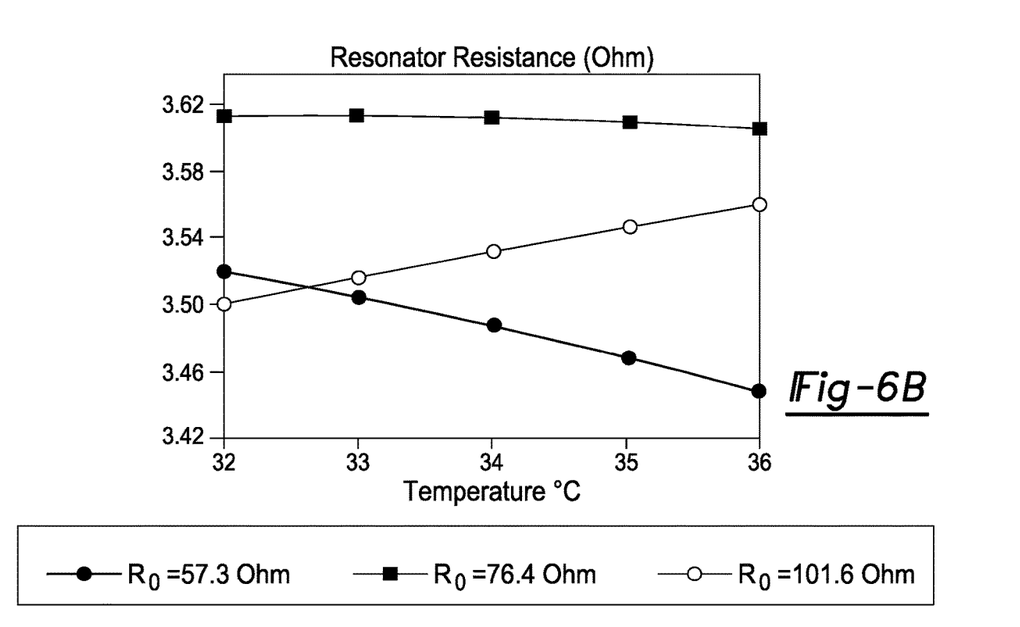
FIG. 6B is a graph showing the effective resistance of the parametric resonator is almost unaffected when the thermistor resistance changes around its optimal value at 76.4 Ohm.

FIG. 6A simulates the temperature-dependent resonance frequency when the resistive loop contains three different thermistors whose resistance are 57.3 Ohm, 76.4 Ohm and 101.6 Ohm at 34 Celsius. As expected, when $R_0=76.4$ Ohm≈$w_{20}L_1$, the frequency-temperature curve has the largest slope at 0.1842 MHz/deg, which is in close agreement with the predicted value of 0.181 MHz/deg obtained by plugging $k^2=(6.6/26.7)^2=0.061$, $\beta=0.0236$ and $\omega_{20}/2\pi=471.8$ MHz into Eq. (6). When $R_0$ is reduced to ~75% or increased to ~133% of 76.4 Ohm, the slopes of gray and blue curves in FIG. 6A decrease by less than 9% compared to the orange curve. Besides resonance frequency shifts, temperature variation in the resistive loop can in principle lead to resistance changes in the parametric resonator. But according to the simulation results in FIG. 6B, when $R_0$=76.4 Ohm, the effective resistance inside the parametric resonator remains almost constant even when the thermistor changes its resistance by 9.4% due to temperature variation. For other non-optimal $R_0$ values, the parametric resonator changes its resistance by at most 2.3%, which is much less than the relative change of thermistor resistance. Therefore, just as what is described in Eq. (9), the linear relation between the oscillation frequency shift and resonance frequency shift should be valid, with little confounding contribution from the resistance ($R_{2d}$) variation of the parametric resonator.

To estimate the required magnitude of pumping current in the parametric resonator for sustained circuit oscillation, harmonic balancing solver is utilized to simulate frequency mixing process. By empirically adjusting the pumping power applied on the resonant enhancer to −10 dBm, the current flow inside the parametric resonator reaches a maximum at 477.8 MHz. At this time, the induced pumping current inside the parametric resonator is 4 mA at 848 MHz, which is consistent with the required $I_{2p}$ value predicted by Eq. (13).

To induce 4 mA of pumping current inside the parametric resonator, the required e.m.f. can be estimated from Eq. (14) when there is no resonant enhancer. In the presence of the resonant enhancer, the required e.m.f. can be estimated from Eq. (21). For each case, the required e.m.f. value can be estimated from the Faraday's induction law $$e.m.f. = -d\phi/dt = -j\omega_p \exp(j\omega_p t) \int B(\vec{r})$$

where the integration is performed over the area defined by the circuit loop. The magnetic flux intensity B(d) inside each voxel can be estimated by CST Microwave studio (Dassault Systèmes, France).

For simplified computation, a human head is modeled as a spherical medium ($\varepsilon_r$=46, σ=0.75 S/m) surrounded by a 1 cm thick shell ($\varepsilon_r$=16.7, σ=0.23 S/m), that represent the brain tissue and skull respectively [16]. The half-wave dipole antenna is modeled as a 17.6-cm conductor wire that is 5-mm separated from the spherical surface to provide enough extra space for apparallel. To estimate the required voltage applied on the activation antenna, first simulate the e.m.f. induced by unit voltage applied on the antenna that is separated from the sensor by a series of distances. Subsequently, the antenna voltage is scaled to make the e.m.f. equal to 0.38 V and 0.033 V respectively, corresponding to the e.m.f. values estimated from Eq. (14) and (21) that are required to induce 4-mA pumping current $I_{2p}$ inside the parametric resonator. The resonant enhancer can reduce the required magnitude of e.m.f. by 11.5-fold for all detection distances, thus reducing pumping power by 21.2 dB. As a result, even when the sensor is displaced from the antenna by 11 cm, only 2.1 V of activation voltage is required on the antenna to oscillate the sensor in the presence of resonant enhancer. This level of voltage will lead to a maximum SAR of ~180 mW/kg throughout the sample, which is well below the safety level recommended by IEC 60601-2-33.

As described above, the wireless resistive sensor consisted of a resonant enhancer, a parametric resonator and a resistive loop. The resistive loop was fabricated by etching a square conductor pattern on a copper-clad polyimide film. The conductor pattern had a dimension of 10×10-mm² with a strip width of 0.75 mm, leading to an effective inductance of 26.7 nH. The conductor loop also had one single gap that was bridged by a thermistor (ERT-J1VA101H, Panasonic, Japan). This thermistor had 76.4 Ohm resistance at 34 deg, approximately equal to the effective impedance of the square inductor at 471.6 MHz (the dipole mode resonance frequency $\omega_{20}$ of the parametric resonator). The parametric resonator consisted of a 10×10-mm² square conductor pattern with two split gaps, both of which were filled by varactor diodes (BBY53-02V, Infineon, Germany) connected in head-to-head configuration, leading to a dipole mode resonance at $\omega_{20}$=471.6 MHz. By bridging the virtual voltage grounds of the dipole mode with a horizontal conductor in the center, the resonator would have another butterfly mode at 370.2 MHz. When the parametric resonator was overlaid on top of the resistive loop through a 2.6-mm polyimide substrate, its butterfly mode was not affected due to geometric orthogonality, but the dipole mode resonance frequency was upshifted with concurrent increase in its effective circuit resistance. To match the quality factor reduction in the dipole mode, a 0.8-Ohm chip resistor was introduced into the resonator's center horizontal conductor to make the quality factor of the two modes approximately equal ($Q_d \approx Q_b \approx 22$). Optionally, another resonant enhancer was overlaid on top of the parametric resonator to locally concentrate magnetic flux at the pumping frequency for improved power efficiency of the pumping field. The resonant enhancer had the same dimension as 10×10 mm² but was serially connected to two 2.7-pF chip capacitors, leading to a resonance frequency at 838.3 MHz. When the substrate thickness between the parametric resonator and the resonant enhancer was adjusted to 5.1 mm, the entire circuit assembly would have a highest resonance frequency at $\omega_p$=848.0 MHz, which was the sum of the dipole and butterfly resonance frequencies at $\omega_2$=477.8 MHz and $\omega_{2b}$=370.2 MHz.

Figure 7A:
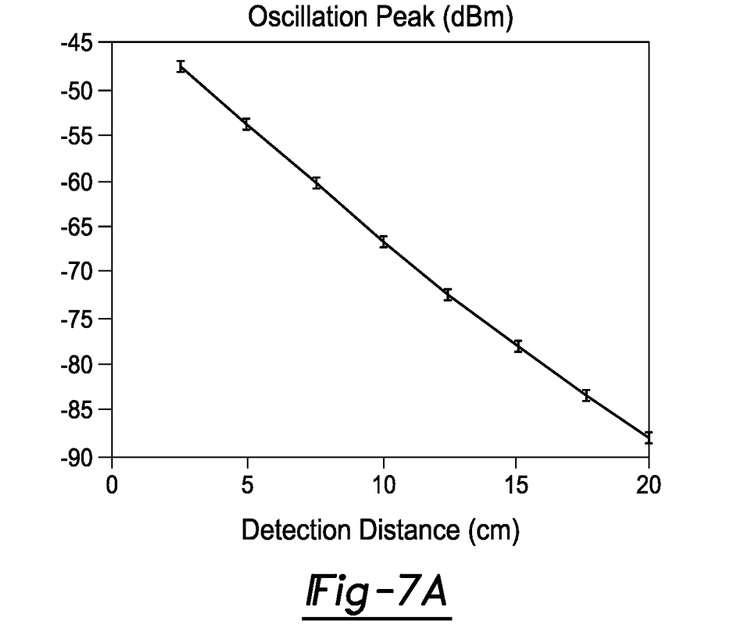
FIG. 7A is a graph showing the height of oscillation peak measured under different distance separations between the sensor and the detection antenna.

To demonstrate the sensor's remote detectability, the sensor inside a rectangular plastic box contained a solution with 146% sucrose and 3.6% NaCl to mimic the brain tissue. Because the sensor was coated by a layer of water-proof epoxy, its resonance frequency remained virtually unchanged when the sensor was soaked inside the tissue-mimicking solution. The solution temperature was controlled by a heating blanket to within 0.1° C. resolution. The activation antenna (17.6-cm length) was horizontally displaced from the sensor by a range of distance separations. The gap between the sensor and the antenna was filled by several solution-containing flasks to emulate the effect of dissipative tissues with varied thickness. When constant pumping power was applied on the activation antenna, the height of oscillation peak was measured as a function of the distance separation between the sensor and the detection loop. This distance separation was varied by changing the number of the plastic flasks overlaying on top of each other. Each flask had a thickness of 2.5 cm. As shown in FIG. 7A, every 2.5-cm increase in the detection distance would lead to about 5.5-dB amplitude decrease of the oscillation peak. Even when the detection antenna was separated by a distance that was 20-fold the sensor's own dimension, the oscillation peak still had a height of −88 dBm, which was 6 dBm above the noise floor of our spectrum analyzer.

Figure 7B:
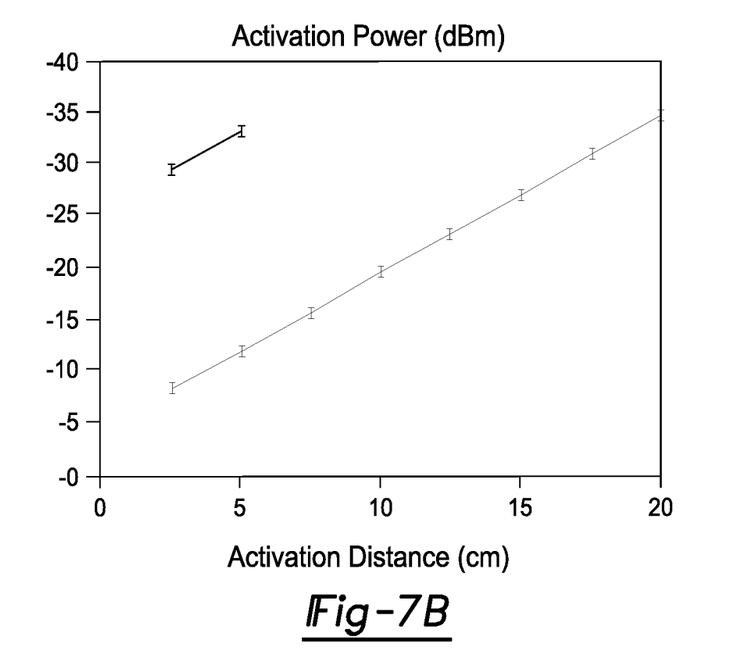
FIG. 7B is a graph showing the measured power required on the activation antenna to oscillate the sensor with and without the resonant enhancer, when the activation antenna is displaced from the sensor by a series of distance separations.

To evaluate the sensor's activation efficiency, a detection antenna was placed at a location that was about 20-cm above the sensor and varied the distance separation between the activation antenna and the sensor. For each distance separation, the required pumping power was gradually increased until the sensor's oscillation signal was clearly observable by the detection antenna, showing up as a sharp peak that was 6-dB above the noise floor of the spectrum analyzer. For comparison purpose, the required level of pumping power was also measured on the same sensor but with the resonant enhancer removed. As shown by the short curve in FIG. 7B, removal of the resonant enhancer increased the required level of pumping power by ~21.2 dB, corresponding to ~11.5-fold increase in the current applied on the activation antenna. When the antenna was separated from the sensor by more than 7 cm, the sensor could no longer be activated in the absence of resonant enhancer because the required pumping power already exceeded the upper limit of our RF amplifier. On the other hand, by incorporating the resonant enhancer, the sensor could still be activated by ~35 dBm of pumping power even though the activation antenna was displaced from the sensor by 20 cm. This distance was sufficiently large to reach most deep-lying organs from the torso surface.

Figure 8:
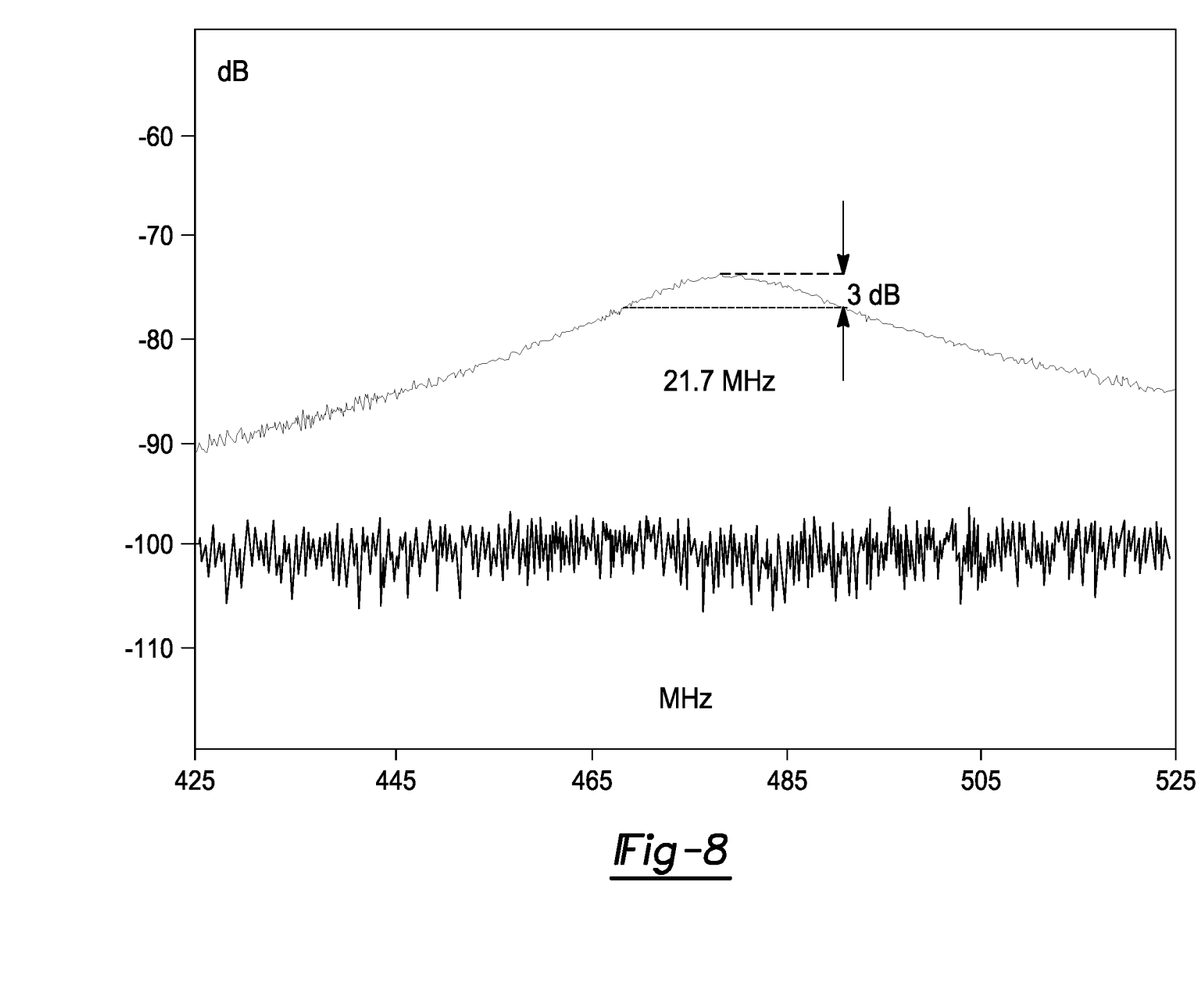
FIG. 8 is a graph showing the frequency response curve measured at 2.5-cm distance separation. When the detection distance was 5 cm, the response curve was completely buried beneath the instrumental noise floor.
Figure 9A:
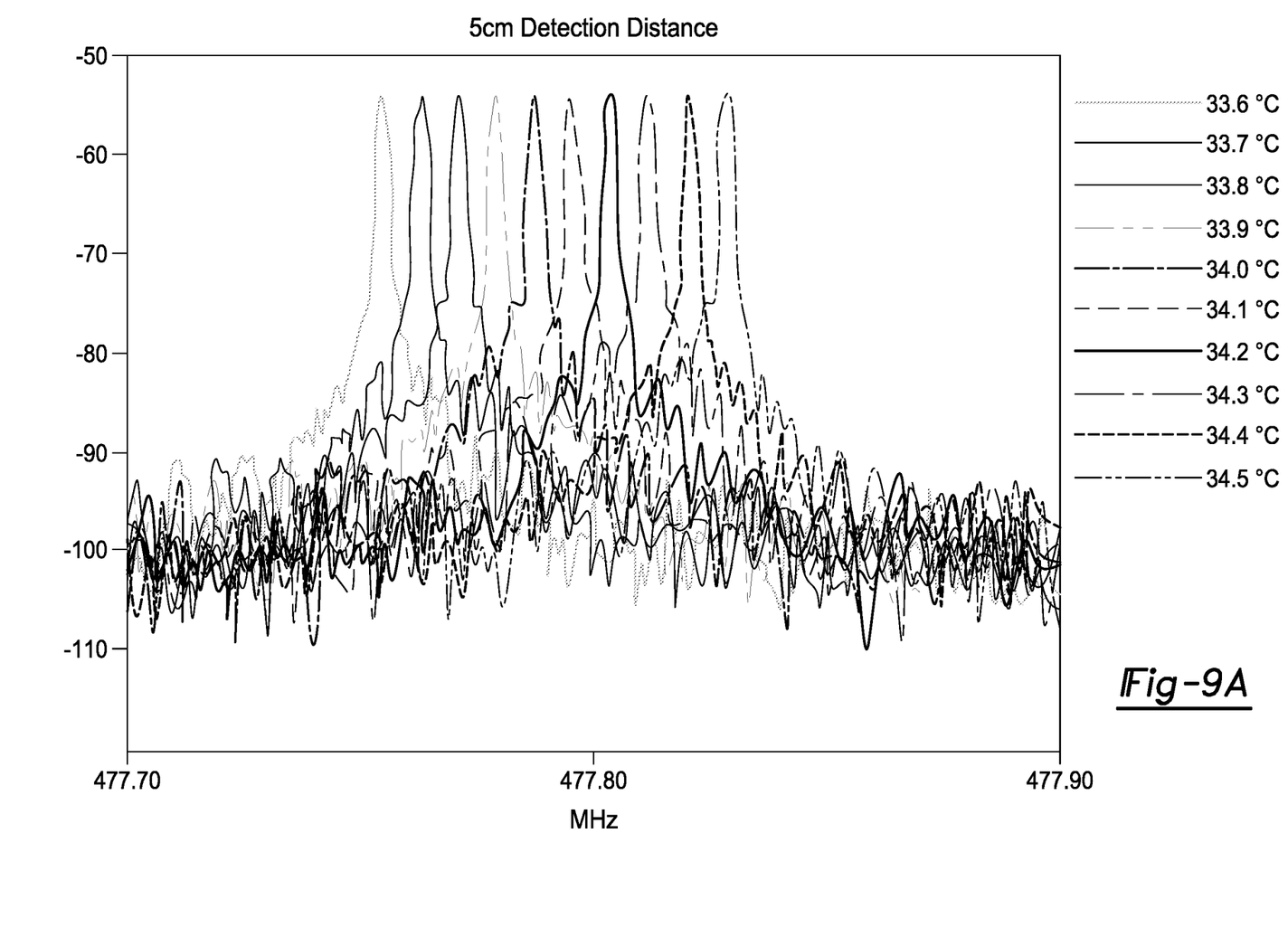
FIGS. 9A and 9B are graphs showing the oscillation frequency at different temperature when the detection antenna was separated from the sensor by 5 cm and 20 cm, respectively.
Figure 9B:
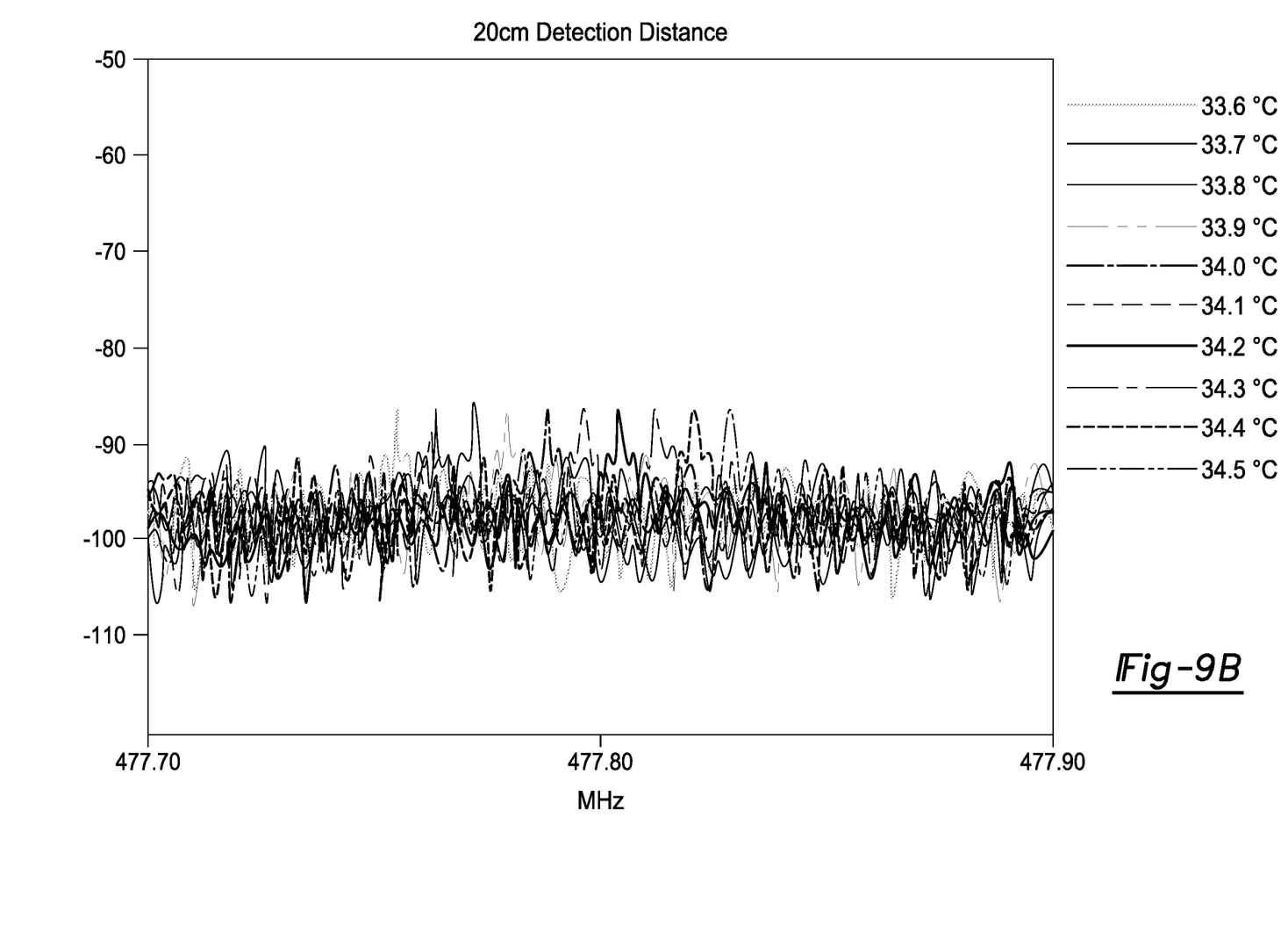
Figure 9C:
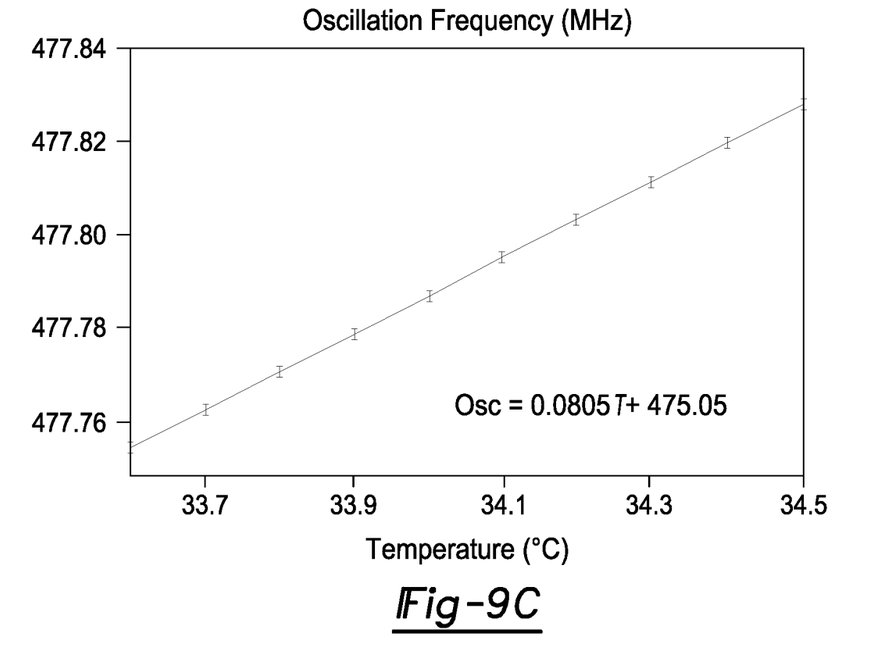
FIG. 9C is a graph showing the linear relation between oscillation frequency and temperature remained virtually identical for both detection distances.
Figure 9D:
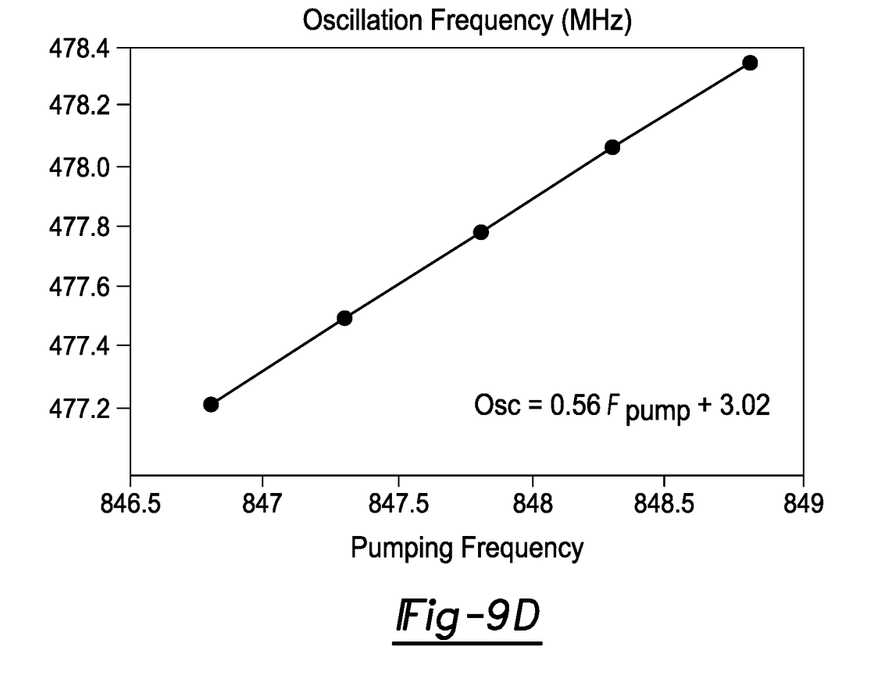
FIG. 9D is a graph showing the linear relation between the oscillation frequency and the pumping frequency could be utilized to correlate oscillation frequency shift with resonance frequency shift based on the relation described in Eqns. (9-10).

FIG. 8 is the frequency response curve of the temperature sensor directly measured by backscattering method. This curve was directly measurable when the sensor was within 2.5 cm distance separation from the detection antenna. However, because the resonator had a 3-dB linewidth of 21.7 MHz, it would be very challenging to precisely measure the much smaller frequency shift induced by 0.1° C. of temperature change. Moreover, when the distance separation was increased to 5 cm, the sensor's frequency response curve was completely buried beneath the instrumental noise floor (blue), making direct characterization based on backscattering method even more challenging.

At 34° C., when ~23 dBm of pumping power was applied on the activation antenna that was separated from the sensor by 12.5 cm, strong oscillation peak (red curve in FIG. 8A) was observed at 477.79 MHz by the detection antenna that was separated from the sensor by 5-fold the sensor's own dimension. When the temperature of the heating blanket was adjusted at 0.1° C. interval, the oscillation frequency also shifted linearly. Every 0.1-degree temperature rise would lead to 8-kHz increase in oscillation frequency, which was 3-fold larger than the 3-dB linewidth of each oscillation peak. When we gradually moved the detection antenna away from the temperature sensor, similar pattern of frequency shift was observed over a range of distance separations. As shown in FIG. 8B, the oscillation signal was still observable by the detection antenna separated by 20 cm, showing up as sharp peaks that were at least 6 dB larger than the instrumental noise floor. This 20-cm detection distance was already sufficient to reach most deep-lying organs from the body surface. When the oscillation frequency was plotted as a function of temperature (FIG. 8C), the linear relation obtained at both distance separations were identical, maintaining the same frequency-to-temperature ratio of 0.08 MHz/deg.

To establish the relationship between the oscillation frequency and the resonance frequency, the temperature constant was held at 34° C. and observed the oscillation frequency as a function of the pumping frequency. As shown in FIG. 8D, every 1-MHz increase in the pumping frequency would lead to 0.56-MHz increase in the oscillation frequency, i.e., $\partial w_d/\partial w_p = 0.56$. According to Eqns. (9-10), the sensor's resonance frequency shift $\Delta w_2$ can be estimated by dividing its oscillation frequency shift ($\Delta w_d$=0.08 MHz/deg) with a factor of (1-0.56), leading to a value of 0.18 MHz/deg. This temperature-induced resonance shift is consistent with the result predicted by Eq. (6).

In this disclosure, a compact wireless sensor was demonstrated that can directly convert temperature-induced resistance changes into oscillation frequency shifts for easy detection over large distance separations. This sensor consists of a nonresonant resistive loop that is coaxially overlaid with a parametric resonator. Through inductive coupling, the resistance change in the thermistor is converted into reactance change in the parametric resonator. To maximize the sensor's frequency response, the dimension of the coupling inductor is adjusted to make its reactive impedance approximately equal to the resistive impedance of the thermistor. As a result, resistance change of the thermistor is converted into linear frequency shift of the parametric resonator, but without changing the effective resistance of the parametric resonator. Unlike previous designs of wireless sensors where the sensing resistor was directly connected to an LC resonator to modulate its quality factor, the thermistor-coupled parametric resonator does not require line-shape analysis of its frequency response curve, thus greatly simplifying the measurement procedure.

Besides the sensor's capability for resistance-to-frequency conversion, the parametric resonator can also utilize its nonlinear capacitance to convert wireless power provided at the sum frequency into sustained oscillation currents supported by the circuit's resonance modes. When the environmental temperature changes, the resonance frequency of the parametric resonator will also shift due to resistance change in the coupler, leading to proportional frequency shift of the resonator's strong oscillation signal. This self-oscillation feature of the wireless sensor can significantly improve the sensor's remote detectability, even when the detection distance is as large as 20-fold the sensor's own dimension. Of course, the oscillation frequency shift is somewhat scaled with respect to resonant frequency shift. To estimate this scaling factor, we can subtract one by the ratio between the oscillation frequency shift and pumping frequency shift, based on the relation described by Eqn. (9-10). In real-day applications, one can experimentally calibrate the sensor's temperature dependent oscillation frequency and directly utilize this calibration curve to estimate temperature change from oscillation frequency shift, without measuring the resonance frequency shift as an intermediate variable.

In the prototype demonstration for resistance-to-frequency conversion, a thermistor with a temperature coefficient of −2.36%/deg can increase the oscillation frequency by 8 kHz for every 0.1° C. of temperature rise. This frequency shift is 3-fold larger than the 3-dB linewidth of the sensor's oscillation peak. Compared to other types of wireless resistive sensors, this wireless resistance-to-frequency converter doesn't require DC voltage to operate, thus obviating the need for extra circuitry and greatly simplifying circuit design. Using a very compact design that requires only a few off-the-shelf components, this wireless resistive sensor can be easily miniaturized, for example to fit inside confined body cavities. When the parametric resonator is overlaid with another resonant enhancer that can locally concentrate magnetic flux at the sum frequency of its resonance modes, the power consumption of the wireless sensor is further reduced by ~21 dB. As a result, the wireless sensor only requires less than −10 dBm of internal power, which can be provided by an external dipole antenna over a large distance separation. For example, when the activation antenna is separated from the sensor by 12.5 cm (a distance that is more than enough to reach the center of adult brain), the pumping power required on the activation antenna is only ~23 dBm, making the Specific Absorption Rate well below the safety limit for most regions surrounding the antenna.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A wirelessly powered resistive sensor, comprising:
an antenna;
a parametric resonator configured to receive a pumping signal from the antenna and operable to oscillate at a frequency; and
a resistive loop circuit having a resistor, wherein the resistive loop circuit is inductively coupled to the parametric resonator, such that oscillation frequency of the parametric resonator changes with changes in resistance of the resistance loop circuit.

2. The resistive sensor of claim 1 wherein oscillation frequency of the parametric resonator changes linearly with changes in resistance of the resistance loop circuit.

3. The resistive sensor of claim 1 wherein the parametric resonator is comprised of at least one electronic component having variable reactance.

4. The resistive sensor of claim 1 wherein the parametric resonator is comprised of a single loop circuit with two varactors in the loop.

5. The resistive sensor of claim 1 wherein the resistance of the resistor in the resistive loop circuit approximately equals the impedance of the resistive loop circuit at one resonance frequency of the parametric resonator.

6. The resistive sensor of claim 1 wherein the parametric resonator is configured to operate in a first resonant mode and a second resonant mode.

7. The resistive sensor of claim 6 wherein the parametric resonator is comprised of two loop circuits which share a common circuit path, each of the two loop circuits includes a varactor.

8. The resistive sensor of claim 6 wherein frequency of the pumping signal is set to sum of resonance frequency of the parametric resonator operating in the first resonant mode and resonance frequency of the parametric resonator operating in the second resonant mode.

9. The resistive sensor of claim 1 further comprises a resonator enhancer circuit arranged adjacent to the parametric resonator and operates to resonate at frequency of the pumping signal.

10. The resistive sensor of claim 1 wherein the resistor of the resistive loop circuit is configured to sense temperature changes, such that oscillation frequency of the resistor changes linearly with temperature changes.

11. The method of claim 1 further comprises quantifying, by the detector circuit, temperature proximate to the resistive loop circuit, where the resistive loop circuit includes a resistor and the resistance of the resistor changes with temperature changes proximate to the resistive loop circuit.

12. A method for operating wirelessly powered resistive sensor, comprising:
receiving a pumping signal into a parametric resonator, where the pumping signal is received wirelessly via an antenna electrically coupled to the parametric resonator and the parametric resonator oscillates at a frequency in response to the pumping signal;
inductively coupling a resistive loop circuit to the parametric resonator; and
measuring frequency at which the parametric resonator oscillates using a detector circuit, where the detector circuit is spatially separated from the parametric resonator and interfaced wirelessly thereto.

* * * * *